BROADBAND, LOW NOISE AMPLIFIER USING A COMMON BASE TRANSISTOR CONFIGURATION
Filed April 3, 1967
FIG.3
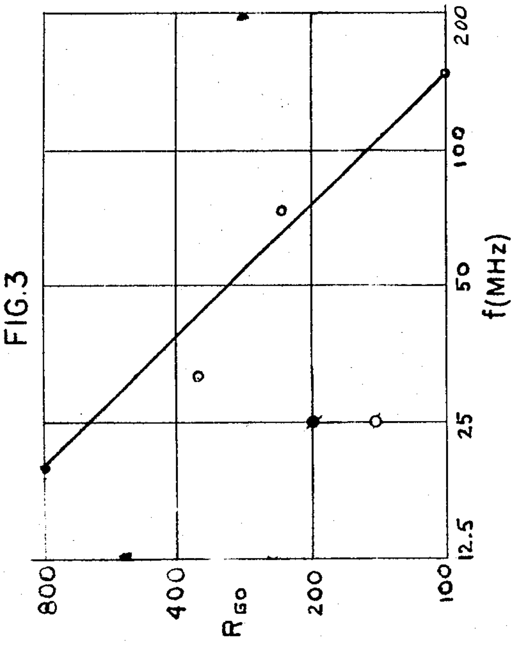
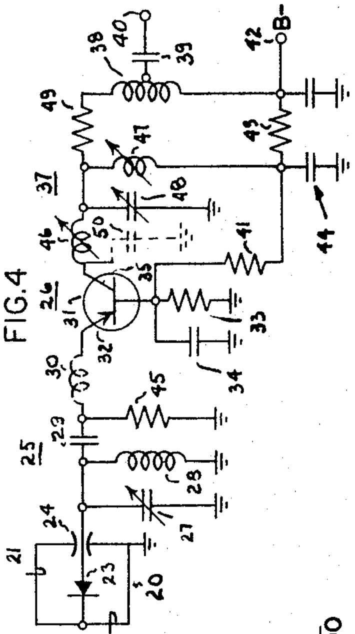
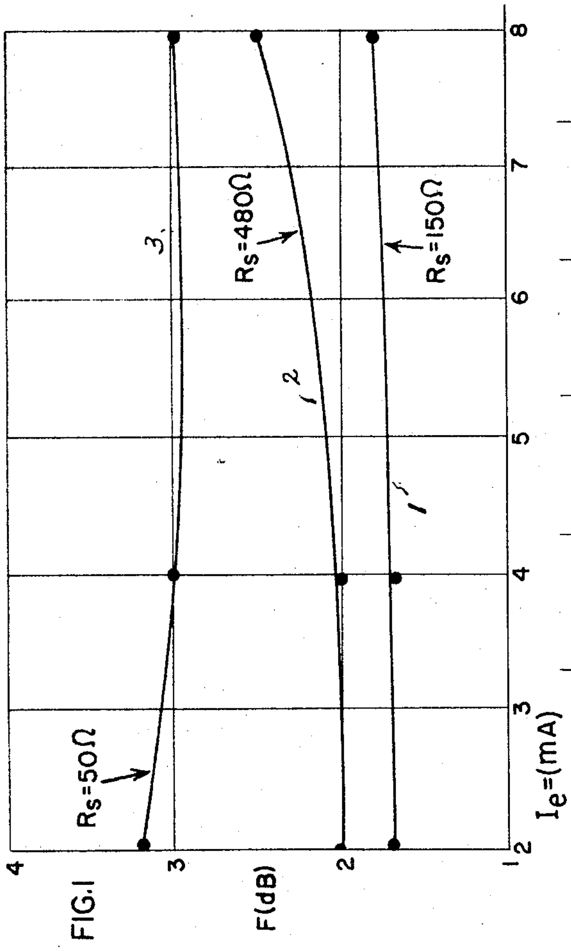
FIG.2
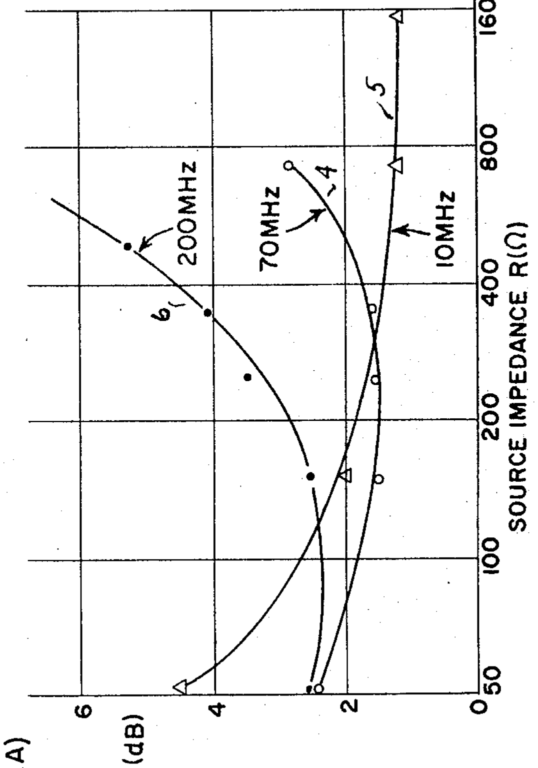
F(dB)
INVENTORS,
JAMES A. HALL,
HARRY J. PEPPIATT,
BY David Blumenfeld
THEIR ATTORNEY.

3,454,895

BROADBAND, LOW NOISE AMPLIFIER USING A COMMON BASE TRANSISTOR CONFIGURATION

James A. Hall and Harry J. Peppiatt, Lynchburg, Va., assignors to General Electric Company, a corporation of New York Filed Apr. 3, 1967, Ser. No. 628,061
Int. Cl. H03f 3/04
U.S. Cl. 330—31 4 Claims

ABSTRACT OF THE DISCLOSURE

A low noise, wideband transistor amplifier using the common base configuration is described. The wide dynamic range and wideband stability characteristics of the common base configuration are taken advantage of, while yet maintaining low noise characteristics by utilizing a mismatch filter having either the maximally flat Butterworth, or the equal-ripple Chebyshev characteristics at the input of the common base transistor. The mismatch filter design permits the transistor, which in the common base configuration has a very low input impedance, to see the relatively high optimum source impedance required for low noise figure.

The instant invention relates to a transistorized amplifier; more particularly, it relates to a wideband, low noise, transistorized amplifier utilizing the common base configuration.

In utilizing transistors as the active elements in amplifier devices, the common base configuration has a number of advantages over the more commonly utilized common emitter configuration. Among these advantages are the dynamic range of the common base connection, which is much superior to that of the common emitter connection. Furthermore, where selective circuits or filters must be utilized at the input of the transistor, it is very difficult with the common emitter configuration to device a wideband, stable amplifier, whereas no such problem exists in the common base configuration. That is, the input impedance for the common base configuration is a series-combination of the normal diode resistance of the emitter-base junction and a small inductive reactance, which is a very nearly linear function of frequency. This inductance is quite small (the inductance for a typical germanium transistor being only 0.02 mirohenry) and remains constant with frequency so that it does not present any substantial obstacle when used in conjunction with an input filter or other selective device. The common emitter configuration, on the other hand, has an input impedance which is a parallel combination of a resistance and a shunt capacitance. This input capacitance varies with frequency. This change in the absolute value of the shunt input capacitance of the transistor with frequency is further complicated in the common emitter configuration by the fact that the capacitance v. frequency characteristic also varies greatly from transistor to transistor. Hence, in the common emitter configuration, the design of a stable, wideband amplifier (one with a bandwidth of ±10 megahertz, for example) is an extremely difficult and troublesome design procedure.

In these various aspects, the common base configuration would seem to be much preferable to the common emitter configuration. However the common base configuration was considered to have one shortcoming which has hitherto limited its applicability in wideband, high-frequency amplifier circuits. This shortcoming was its obstensibly poor noise characteristics. For low noise figure, it is necessary that the transistor see a source impedance which is optimum for low noise operation, but is not necessarily optimum for efficient power transfer or other operating characteristics. The optimum source impedance for low noise operation of a transistor in its common base configuration is in the order of 200 ohms. The input resistance of a transistor in the common base configuration, however, is extremely low, being in the order of 5 to 15 ohms, the exact magnitude being a function of the emitter current so that there is a severe mismatch betweeen the input impedance of the transistor and its optimum low noise source impedance. In accordance with hitherto known design concepts, filters and selective circuits, when used with transistors in a common base configuration, were designed both to have a desired frequency response and also to match the input impedance of the transistor. The transistor thus no longer saw the optimum low-noise source impedance. This, of course, resulted in a very poor noise figure.

Because of the seemingly poor noise characteristics of the common base configuration when used with an impedance-matching filter, it was considered to have limited usefulness even though it had many advantages, as pointed out before, in terms of wide dynamic range and stable wideband characteristics. The common emitter configuration was thus preferred in this context, since the input impedance in this configuration was in the order of 100 ohms, so that this configuration had a fairly good noise figure, as well as fairly good power transfer characteristics when used with an impedance-matching filter or selective input network.

Applicant has been the first to recognize, however, that all of the advantages, in terms of wide dynamic range and wideband operation, of the common base configuration may be realized while yet providing a very good noise figure by utilizing specially designed mismatch filters between the signal source and the input of the common base transistor which permits the transistor to see the desired optimum source impedance for best noise performance.

It is, therefore, a primary objective of this invention to provide a wideband, low noise, common-base transistor-amplifier.

A further objective of this invention is to provide a wideband amplifier connected in the common base configuration, which has a frequency-selective network coupled to its input which has a transfer characteristic such that the transistor sees the optimum source impedance for good noise performance.

Other objectives and advantages of the invention will become apparent as the description thereof proceeds.

The various objectives and advantages of the invention are realized by providing a common base transistor-amplifier in which the input of the transistor is coupled to the signal source through a specially designed frequency-selective network. The frequency-selective network is of a mismatch filter design, i.e., a filter which has a prescribed insertion-loss response (either a Butterworth maximally-flat magnitude, or a Chebyshev equal-ripple magnitude) characteristic over the desired passband while operating between unequal source and load impedances. Thus, the output impedance of the mismatch filter as seen by the load, i.e., the transistor input, does not match the load impedance. By coupling a mismatch filter to the input of the common base transistor, the optimum source impedance required to give minimum noise figure may be provided while yet retaining all of the desirable wideband, stable characteristics of the common base configuration.

The novel features which are believed to be characteristic of this invention are set forth with particularity in the appended claims. The invention, itself, however, both as to its organization and method of operation, together with further objectives and advantages thereof, may best be understood by reference to the following description when taken in connection with the accompanying drawings in which:

FIGURE 1 is a graph showing the relationship between noise figures of a typical low-noise, grounded base transistor for various source impedances;

FIGURE 2 is a graph showing the variations of noise figure with source impedance for different frequency ranges;

FIGURE 3 is a graph showing variations of the optimized noise figure with frequency;

FIGURE 4 is a schematic illustration of a grounded base amplifier constructed in accordance with the invention.

In the common base configuration, there is a wide disparity between the required source impedance for optimum noise figure and the transistor input impedance. Whenever the common base configuration is used in conjunction with a selective input network (such as a filter, for example, to select only a desired band of frequencies, or to suppress harmonics, etc.), substantial difficulties are encountered with this configuration, since the known and hitherto accepted design procedure is to build a filter over the desired frequency range which, in addition to producing the desired selectivity, also matches the source impedance to the transistor input impedance. While this has a beneficial effect from the standpoint of raising the power transfer efficiency, the impedance matching characteristics of the selective network severely affect the noise figure of the transistor, since the transistor no longer sees the optimum source impedance for low noise operation. Hence, in the past, because of this poor noise performance of the common base configuration, when built in accordance with the acepted design procedures, the common emitter configuration was preferred. This may perhaps be understood more easily in connection with the graphs of FIGURES 1 through 3 which illustrate the operating characteristics of the transistors in the common base configuration in terms of frequency, source impedance, noise, etc. FIGURE 1 illustrates the noise characteristics (at 70 megahertz) of a germanium transistor, such as the 2N2996, connected in the common base configuration, as a function of both the transistor input impedance and of the source impedance. In FIGURE 1, the noise figure F in db is plotted along the ordinate, and the emitter current in milliamps along the abscissa. The emitter current, of course, determines the transistor input impedance, since it is well known that in the common base configuration the input resistance component of the transistor, which is the major part of the input impedance, is approximately equal to $26/I_e$, i.e., $$r_d = \frac{26}{I_e}$$

It will be seen that the variations of the noise figure, with emitter current and, hence, transistor input resistance variations, are slight; but the variation is substantial as the source impedance is changed. Curve 1 shows the variation of the noise figure with variations in transistor emitter current and, hence, $r_d$ for a noise source impedance of 150 ohms. Curve 2 illustrates the variations of the noise figure for a source impedance of 480 ohms; and curve 3, the variations for a source impedance of 50 ohms. With a source impedance of 150 ohms, the noise figure stays substantially constant, even though the input resistance component $r_d$ of the transistor varies between approximately 3½ and 13 ohms. It will also be apparent from FIGURE 1 that for the common base configuration, there is an optimum source impedance or resistance for low noise figure which does not vary substantially over the desired dynamic operating range of the transistor.

FIGURE 2 illustrates the relationship between noise figure and source impedance in order to illustrate the effect on the noise figure of the magnitude of the source impedance at different frequencies. In FIGURE 2, the noise figure in db is again plotted along the ordinate, and the source impedance R(Ω) along the abscissa. The measurements are for a germanium transistor (2N2996) with the emitter current fixed at 2 milliamperes so that the input resistance of the transistor is fixed at approximately 13 ohms. Curve 4 illustrates the variations of the noise figure with source impedance at 70 megahertz, while curves 5 and 6 show the corresponding variations at 10 and 200 megahertz, respectively. At 70 megahertz, it may be noted that the optimum source impedance for minimum noise figure falls in a narrow range between 170 and 230 ohms. If the source impedance seen by the transistor input is maintained in this range of values, the noise figure of the transistor is below 2 db and low noise operation of the transistor device in the common base configuration is feasible.

FIGURE 3 illustrates the variation of the noise figure with frequency with the source impedance optimized at the various frequencies. Thus, in FIGURE 3, optimum source impedance $R_{GO}$ is plotted along the ordinate, with the frequency in megahertz along the abscissa; the characteristics again being for germanium transistors of the type previously specified, with the emitter current maintained at 2 milliamperes. The optimum source impedance may be obtained for each frequency, and for a given transistor, either by measurement techniques wherein curves of the type in FIGURES 1 and 2 may be obtained, or they may be calculated from the formula for optimum source impedance, $$R_{GO} \simeq \sqrt{\frac{R_{bb^1}+R_e/2}{qI_e/2KT}} \cdot \frac{fd}{f}$$

This formula for optimum noise impedance is derived from the well known expression for noise figure, $$F \simeq 1 + \frac{R_{bb^1}+R_e/2}{R_g} + \frac{qI_e}{2KT} \cdot \frac{f^2}{f\alpha^2} \cdot R_g \left[1 + \frac{R_{bb^1}+R_e}{R_g}\right]^2$$

where:

$R_{bb^1}$=The bare resistance,
$R_e$=The resistance of the base-emitter diode,
$I_e$=The emitter current,
$f$=The frequency,
$f\alpha$=The $\alpha$ cut-off frequency, and
$R_g$=The source resistance.

By calculating or measuring the proper optimum source impedance at each of the frequencies, the curve of FIGURE 3 may be obtained. It may be seen from curve 7 that $R_{GO}$ varies with frequency; but over a 20 megahertz band, these variations are not substantial, thus establishing that wideband operation of the common base transistor is feasible with (as may be seen from FIGURE 2) a relatively small variation of the noise figure over the band. Thus, a signal varying ±10 megahertz about a center frequency of 70 megahertz, for example, will produce a very small variation about a low noise figure if some way is found to maintain the desired mismatch between the source impedance and the input impedance of the transistor in the common base configuration, even though a frequency selective network, such as a filter, is coupled between the source and the transistor input.

Applicants' invention is based in part on the recognition that this may be realized by utilizing a filter section designed for operation with mismatch termination so that the transistor input sees the desired source impedance. Such a filter section has the desired insertion loss response and selectively over the band, i.e., either a maximally flat Butterworth response, or the equal-ripple Chebyshev response over the frequency of interest, but the transistor input sees only the source impedance. The mismatch filter for the desired impedance ratio for optimum noise figure may be designed by synthesis techniques in which the low pass, prototype ladder network is first synthesized. This low pass prototype is converted by impedance and frequency transformations to the desired mismatch filter having the proper number of sections and for the given resistance ratio between source impedance and the transistor input impedance. These conversions will involve, among other things in the conversion proceeding, the bisection of the symmetrical prototype filter at the plane of symmetry, and the conversion for any one of the high pass, low pass, bandpass, bandstop, or other characteristics in order to derive the desired component value. The technique for designing such mismatch filters for various impedance mismatch ratios, and for various number of sections *n* for both the maximally flat Butterworth and equal-ripple Chebyshev characteristics, are described thoroughly, including tabulations of component values for various values of resistance ratios *r* and various numbers of sections *n*, in Chapter 13 of Network Analysis and Synthesis by Louis Weinberg, McGraw-Hill Book Company, Inc. (1962), New York. Chapter 13 of the book, entitled "Practical Filter Design Made Easy—Handbook Tables of Element Values and Explicit Formulas," pages 600–628, describes a number of procedures for synthesizing the prototype low-pass ladder network and the frequency and impedance conversion necessary to produce any desired network. Furthermore, on pages 600–619, tables of element values in farads and henries for various numbers of sections for both Butterworth and Chebyshev characteristics are provided; in the case of the Butterworth response, for various mismatch ratios between source and load, and in the instance of the Chebyshev response, both for various degrees of ripple, as well as the desired mismatch ratios. Through the use of the synthesizing procedures described in Chapter 13 of Weinberg, a suitable mismatch filter may be designed which, when utilized in conjunction with a common base transistor circuit, provides a wideband, low noise, transistor-amplifier in which the source resistance seen by the transistor may be optimized for best noise performance by maintaining the desired mismatch between the source impedance and the transistor input.

FIGURE 4 is a schematic circuit diagram of one form of a low-noise, wideband, common base transistor amplifier coupled to the output of an RF mixer and adapted to amplify a high-frequency (in this case 70 megahertz) signal. The common base transistor amplifier illustrated in FIGURE 4 is one which has a low noise characteristic for a signal having a 70 megahertz center frequency and a bandpass characteristic of ±10 megahertz, with a noise figure variation of less than 1 db over the passband.

FIGURE 4 shows a mixer cavity 20, having input and local oscillator signals applied thereto through a pair of input loops 21 and 22 from signal and local oscillator sources, not shown. An RF mixing diode 23 is mounted across the waveguide with one end connected to the grounded waveguide wall, and the anode connected through a feedthrough capacitor 24 to the input of a mismatch Chebyshev filter shown generally at 25, which, in turn, is coupled to the input of a grounded base transistor illustrated at 26. Feedthrough capacitor 24 provides a wideband short for the RF frequency signal, and the local oscillator signal, so that only the IF frequency signal (70 mHz. ±10 mHz.) appears at the input of the mismatch filter. Mismatch filter 25 is a four-section filter consisting of the parallel combination of variable capacitor 27 and feedthrough capacitor 24, shunt inductor 28, series capacitor 29, and the series input inductance of the transistor shown in dashed lines at 30. Inductor 28 tunes with the shunt capacitor 27 and the diode capacitance of mixer-diode 23 and feedthrough capacitor 24 at the center frequency of 70 megahertz. Input inductor 30 of the germanium transistor 31 tunes with the series capacitor 29 also at the center frequency of 70 megahertz. The mismatch filter 25 is designed to have a Chebyshev response characteristic with approximately 4 db ripple, and operates into a transistor input resistance component of approximately 13 ohms from a source impedance of approximately 170 ohms for the mixer. This mixer impedance, it will be recalled from FIGURE 2, falls within the range of source impedance values for which the noise figure is close to the minimum. The input inductance 30 of the germanium transistor is approximately 0.02 microhenry and is, as pointed out previously, the part of the two-section Chebyshev filter shown generally at 25. PNP transistor 31 forming part of the amplifier is a germanium transistor which is connected in the common base configuration, with its emitter 32 connected directly to the output of the mismatch filter, its base connected through resisor 33, which is bypassed for RF by capacitor 34, to ground. Collector 35 is connected through a broadband, symmetrical matching network, shown generally at 37, a distributed line transformer 38, and coupling capacitor 39, to an output terminal 40 which may be connected to the input of a IF-amplifying stage. The quiescent biasing conditions for transistor 31 are maintained at a level to produce an emitter current of approximately 2 milliamperes through a biasing network consisting of dropping resistor 41, connected between the base of the transistor and the B— terminal 42 through the series resistor 43 of filter 44. Emitter 32 is connected to ground through resistor 45, which is connected to the junction of capacitor 29 and the emitter. Collector 35 is connected to the junction of resistor 41 and 43 through the variable inductors 46 and 47 of the matching networks to establish the proper biasing conditions for the transistor.

The matching network is adjusted for flat amplitude and group-delay over the 20 megahertz band. It consists of variable series inductor 46, a shunt inductor 47, a variable shunt capacitor 48 connected to the junction of inductor 46, the transistor output capacitance 50, and a series resistor 49. Inductors 46 and 47, capacitor 48 and resistor 49 form, as described previously, a symmetrical, broadband matching network which gives a flat amplitude and group delay characteristic over the 20 megacycle passband of the amplifier. The matching network is a slightly undercoupled, double-tuned, T equivalent transformer in which, for broadband purposes, the third inductor of the T has zero inductance and is omitted. The response of this network is adjusted so that the overall amplitude and group delay response is very flat and symmetrical about the 70 megahertz center frequency. Such matching networks are well known in the art, and no further description thereof need be given here.

Distributed line transformer 38 is wound on a ferrite core, and a center tap on the winding is coupled through the coupling capacitor to output terminal 40. Distributed line transformer produces an impedance transformation of approximately 4 to 1 for now matching the output impedance of transistor 31 to the input impedance of the further transistor amplifier, and also provides current gain in order of approximately 6 db.

Distributed line transformers are well known devices which are characterized by an extended, high-frequency response and consist of a pair of conductors wound as a transmission line on a suitable core, so that the interwinding capacity is minimized or eliminated. Typically, in such a distributed line transformer, a pair of leads which may be encased in a suitable insulating material are wound in pairs over a core which may be of triodal or other shape. Two leads being thus wound on the core form a transmission line and simultaneously constitute the primary and secondary of the transformer. The interwinding capacity which would normally limit the response of a normal transformer now forms part of the distributed parameters of the transmission line and, thus, has no or minimal effect on the high-frequency response. These are, therefore, very useful devices in a broadband (i.e., 20 megahertz bandwidth) amplifier circuit. For a more detailed discussion of distributed line transformers, their construction and characteristics, reference is hereby made to the article entitled "Broadband Transformers," by C. L. Ruthroff, Proceedings of the I.R.E., volume 47, No. 8, August 1959, pages 1337–1342. By constructing the output transformer 38 as a distributed line transformer, a flat amplitude and phase response over the entire 20 megacycle band may be achieved.

A grounded base, wideband amplifier having a bandwidth of ±10 megahertz centered about 70 megahertz was constructed in accordance with the invention by synthesizing a mismatch filter having a Chebyshev response with approximately 4 db ripple, intended to operate between a source impedance of approximately 170 ohms and operating into a low input impedance of approximately 13 ohms. The amplifier had an IF noise figure of less than 1 db over a 20 megahertz bandwidth, and was constructed with the following component values:

| | | |
|---|---|---|
| Transistor **31** | | Germanium 2N2996 |
| Mixer diode **23** | | IN23G |
| C24 | picofarads | 25 |
| C27 | do | 8–50 |
| C29 | do | 270 |
| C34 | do | 470 |
| C39 | do | 470 |
| C48 | do | 5–25 |
| C43 | do | 470 |
| R33 | ohms | 10K |
| R41 | do | 2.7K |
| R43 | do | 470 |
| R45 | do | 9.1K |
| R49 | do | 470 |
| L28 | μh | 0.13 |
| L46 | μh | 1.2–1.8 |
| L47 | μh | 0.5–0.8 |
| B– | | –24 |

It will be appreciated, therefore, that applicants' invention makes possible the realization of a low noise, wideband, common base transistor amplifier which has a noise degradation of 1 db or less over a bandwidth of 20 megahertz. This has been achieved with a common base configuration, and all the known additional advantages of this configuration. Hence, applicants have achieved not only wide dynamic range and stable wide bandwidth operation, but also low noise characteristics, whereas in the past it was always necessary to make a choice of one or more of these characteristics by either going to the common base configuration, with its bad noise characteristics when used with an impedance matching filter, or if one wanted low noise characteristics, to take the narrow bandwidth and narrow dynamic range of the common emitter configuration.

Although one particular embodiment of the subject invention has been described, many modifications may be made, and it is understood to be the intention of the appended claims to cover all such modifications as fall within the true spirit and scope of the invention.

What we claim as new and desire to secure by Letters Patent of the United States is:

1. A wideband, low-noise transistor amplifier comprising:

(a) a transistor connected in the common base configuration having a low input impedance, (b) a wideband, frequency-selective impedance-mismatching network having its output coupled to the input of said transistor and its input coupled to a signal source having an impedance greater than the impedance of said transistor, (c) the transfer characteristics of said network being such that the network maintains an impedance mismatch relationship over the frequency range of the network so that the impedance seen at the output of said network is substantially the impedance of the signal source which is at a level required for low-noise operation of the transistor over the entire frequency band.

2. The wideband amplifier according to claim 1 wherein said selective network is a mismatch band-pass filter having a Chebyshev equal-ripple characteristic.

3. The wideband amplifier according to claim 1 wherein said selective network is a mismatch band-pass filter having a Butterworth maximally-flat characteristic.

4. The wideband amplifier according to claim 1 wherein the selective network consists of a variable shunt capacitor and a shunt inductor which tune at the center frequency of the frequency band, a series capacitor connected between the shunt inductor-capacitor combination and the input of said transistor, said series capacitor tuning with the input inductance of said transistor at the center frequency.

References Cited

UNITED STATES PATENTS

| | | | |
|---|---|---|---|
| 2,799,736 | 7/1957 | Hannon | 330—192 |
| 3,281,708 | 10/1966 | Rogers et al. | 330—12 |

FOREIGN PATENTS

| | | |
|---|---|---|
| 618,685 | 4/1961 | Canada. |

JOHN KOMINSKI, *Primary Examiner.*

U.S. Cl. X.R.

330—186, 195